United States Patent
Lohrmann

[11] 4,035,732
[45] July 12, 1977

[54] HIGH DYNAMIC RANGE RECEIVER FRONT END MIXER REQUIRING LOW LOCAL OSCILLATOR INJECTION POWER

[75] Inventor: Dieter R. Lohrmann, Lanham, Md.

[73] Assignee: The United States of America as represented by the Secretary of the Army, Washington, D.C.

[21] Appl. No.: 666,832

[22] Filed: Mar. 15, 1976

Related U.S. Application Data

[63] Continuation of Ser. No. 511,860, Oct. 3, 1974, abandoned.

[51] Int. Cl.$^2$ .......................................... H03D 7/14
[52] U.S. Cl. ............................ 325/446; 325/449; 325/489; 363/163
[58] Field of Search .......... 321/60, 69 R; 332/43 B, 332/44; 329/203, 204, 205, 206; 325/430, 438, 439, 446, 449; 330/10

[56] References Cited
U.S. PATENT DOCUMENTS

| | | | |
|---|---|---|---|
| 2,814,780 | 11/1957 | Edwards | 325/449 |
| 3,217,265 | 11/1965 | Lungo | 330/174 |
| 3,678,395 | 7/1972 | Hunton et al. | 321/69 R |
| 3,727,154 | 4/1973 | Dailing et al. | 330/174 |
| 3,831,097 | 8/1974 | Neuf | 325/446 |

*Primary Examiner*—Benedict V. Safourek
*Attorney, Agent, or Firm*—Nathan Edelberg; Frank Dynda; Sheldon Kanars

[57] ABSTRACT

An improved circuit utilized in an RF tuner or receiver for selecting and converting an RF signal to an intermediate frequency with reduced injection power requirements. The circuit is utilized in the "front end" of a radio frequency receiver or tuning section, the purpose being to convert the received RF signal to an intermediate frequency. The improved circuit comprises and includes a diode sampling bridge coupled to an RF signal receiving source, such as an antenna, a local oscillator coupled across the bridge providing pulses for actuating and turning on particular diodes of the bridge for a relatively short length of time. The bridge output is coupled to a selecting transistor, which may include a crystal filter coupled to the emitter of the transistor. The pulsing signal across the diode bridge is relatively short in comparison with the received RF signal. When the diode sampling bridge is conducting, the RF signal is mixed and passed to the selecting transistor base. The selecting transistor, with its emitter coupled to the crystal filter, amplifies only a signal of a desired frequency. The short pulse actuation in the front end for mixing requires less injection power, allowing the circuit to be adapted for use with battery powered equipment.

3 Claims, 1 Drawing Figure

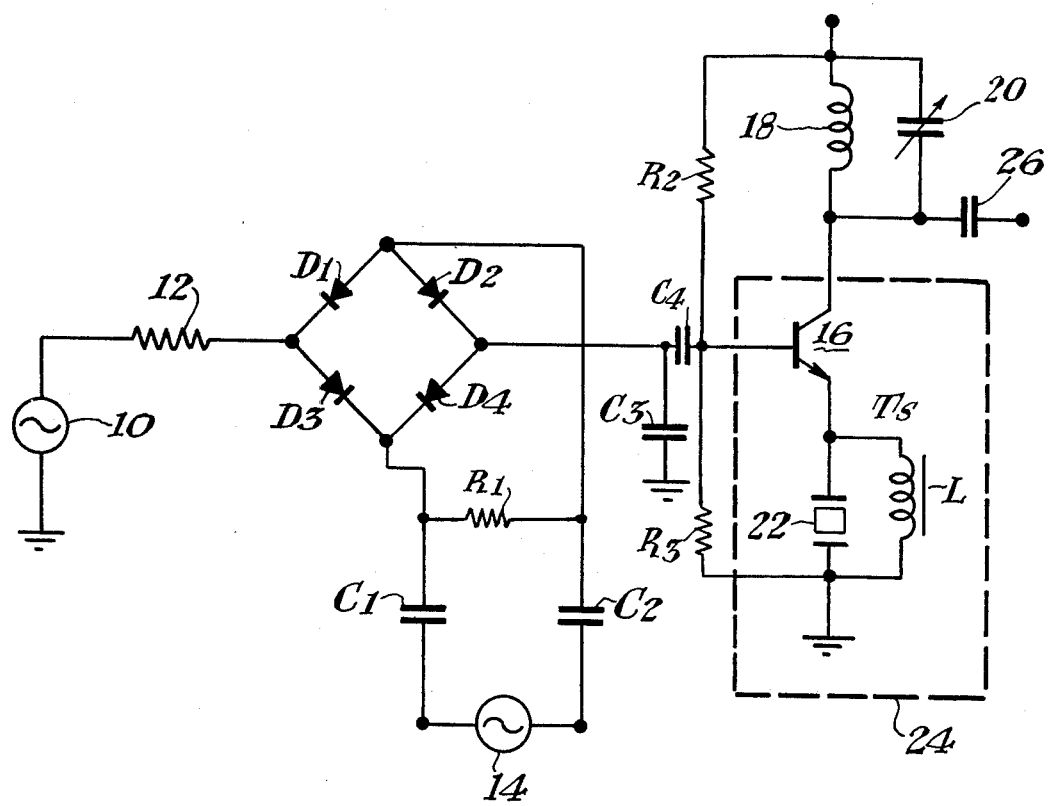

HIGH DYNAMIC RANGE RECEIVER FRONT END MIXER REQUIRING LOW LOCAL OSCILLATOR INJECTION POWER

The invention described herein may be manufactured and used by or for the Government for governmental purposes without the payment of any royalties thereon or therefor.

This is a continuation of application Ser. No. 511,860, filed Oct. 3, 1974 (now abandoned).

BACKGROUND OF THE INVENTION

The instant invention relates generally to an improved "front end" circuit utilized with a radio frequency receiver, and specifically to an improved front end mixer which requires less injection power without detrimentally affecting RF signal selectability of the circuit.

In the operation of a radio frequency receiver front end, it is desirable to have high dynamic range and receiver frequency selectability, especially when the receiver is located at close range or in close frequency allocation to the RF transmitter, situations which oftentimes may "jam" the receiver. One way shown in the prior art to provide high dynamic range has been through the use of a parametric mixer-preamplifier. However, the power requirements of this circuit present a problem in the application of this type of circuit in battery operated, pack set radios and the like because of the high amount of local oscillator injection power required. The instant invention provides a mixer circuit which has a low level local oscillator injection power requirement achieved by utilizing a sampling diode bridge for the RF receiver "front end" mixer.

BRIEF DESCRIPTION OF THE INVENTION

An improved radio frequency receiver front end mixer requiring low local oscillator injection power comprising an RF signal source, Cowan type bridge sampling means coupled to said signal source, a local oscillator coupled to said sampling means for turning the sampling means on or off, an IF amplifier means coupled to said sampling means, said IF amplifier including a transistor and an RF signal filter means connected to the emitter lead of said transistor. The sampling means is comprised of a diode bridge having an input connected to the signal source, such as an antenna, the bridge having connected across it a local oscillator having capacitive means on each input to said bridge. The bridge output is coupled to a capacitor and to a selecting transistor which in one embodiment has a crystal filter coupled across the emitter lead of the transistor. The transistor acts as a first stage IF amplifier, with the crystal selected to pass the intermediate frequency.

In operation, the local oscillator produces pulses which are very short in duration compared to the times of one cycle of the RF input signal. The very narrow pulse or sampling pulse is generated at each cycle of the local oscillator, which may be accomplished using a triggered blocking oscillator or a step recovery diode. Therefore, a peak injection pulse is provided only during part of an input cycle. The local oscillator injection pulses are utilized to turn on the diodes in the sampling bridge making them conductive which allows the RF signal voltage from the signal source to pass and subsequently charge a capacitor. When the local oscillator injection pulses are not present, the sampling bridge is essentially an open circuit. The capacitor coupled to the sampling bridge output and capacitors coupled to the local oscillator output act to reversely bias the diodes of the bridge after the pulse has ended, insuring that the bridge will remain off. The turning off and on of one signal by another results in mixing and produces the sum and difference frequencies as the input to the selecting transistor which acts as the first IF amplifying stage for the receiver. The instant invention circuitry insures that even if an "unwanted," strong adjacent different frequency signal is present, the desired frequency signal will not be attenuated by the adjacent frequency signal strength. The selector transistor has heavy counter-feedback for all frequencies except the IF. The IF stage comprising the selective transistor, including the crystal filter coupled across the emitter leg of the transistor, passes only the IF and amplifies it. The crystal filter coupled to the emitter lead is selected to be series resonant providing a high impedance to all frequencies except the IF. Thus, signals of all other frequencies will not be amplified, as the transistor acts as an open circuit of these frequencies. The amplified IF signal is coupled to a second IF stage which further reduces unwanted signals while amplifying the desired one.

Thus, the circuit may be employed in the front end of a battery powered RF receiver because the local oscillator injection power requirement is greatly reduced while the selectivity of proper signal frequency is maintained.

It is an object of this invention to provide a high dynamic receiver front end mixer which requires relatively low local oscillator injection power.

It is another object of this invention to provide improved radio frequency receiver front end circuitry which utilizes a local oscillator pulse actuated sampling bridge.

It is another object of this invention to provide an improved RF turner front end receiving circuit which mixes and provides a predetermined signal to the IF amplifier, said circuit having a reduced injection power requirement and a high input signal frequency selectivity to prevent close range or close frequency receiver interference.

Yet still another object of this invention is to provide a radio frequency receiver which may be battery operated having a high frequency selectivity range with low input voltage power requirements.

In accordance with these and other objects which will be apparent hereinafter, the instant invention will now be described with particular reference to the accompanying drawings.

BRIEF DESCRIPTION OF THE DRAWING

The drawing shows a schematic diagram of the instant invention including the circuit elements of the preferred embodiment of the invention.

PREFERRED EMBODIMENTS OF THE INVENTION

Referring now to the drawing, the instant invention is shown coupled to a RF signal source 10 with its inherent resistance 12 which represents an RF antenna or the like coupled to the input of a sampling bridge having four diodes, D1, D2, D3, and D4, connected in a bridge arrangement to a local oscillator 14 coupled on one side to the anodes of D1 and D2 and on the other side to the cathodes of D3 and D4, with a pair of capacitors C2 and C1 connected between respectively. A resistor R1 is coupled across capacitors C1 and C2. The output of the sampling bridge is connected to capacitor C3 and capacitor C4 which is coupled to the input of an IF stage amplifier 24 comprising transistor 16 connected to the output of the diode bridge through capacitor C4, with the emitter lead of transistor 16 coupled to a crystal filter 22, the crystal filter 22 having inductor L coupled thereacross. A pair of resistors R2 and R3 are connected to the base of transistor to 16. Capacitor C4 and resistors R2 and R3 are biasing elements for providing the proper potential to the base of transistor 16. The inductor L tunes out parallel capacity of crystal 22 and passes DC current to the transistor 16. The collector lead of the transistor 16 is connected to a filter comprising inductance 18 and a variable capacitor 20. The amplified IF output from IF stage 24 may be fed to an additional IF stage through capacitor 26. A bipolar transistor is shown in the drawing, but a field effect transistor may be used as well.

In operation, the RF signal is received on a conventional antenna or the like which is represented by oscillator 10 coupled to inherent resistance 12. The local oscillator 14 produces pulses which are very short in duration compared to the time of one cycle of the input signal received at the sampling diode bridge. The pulses from local oscillator 14 turn on diodes D1, D2, D3 and D4, causing the diodes to conduct during the short time interval of the pulse. A positive pulse is coupled to the anodes of D1 and D2 while a negative pulse at exactly the same time is coupled to the cathodes of D3 and D4. At the peak of the pulse, the diodes are biased on, therefore, conducting a signal from the antenna allowing it to pass and subsequently charge capacitor C3. When the local oscillator 14 pulses are not present, the diodes are essentially an open circuit except for normal leakage current. Charges on C1 and C2 insures that the diodes are reversely biased after the pulse from the local oscillator 14 is ended such that the diodes will remain off. The switching on and off across the sampling bridge results in a mixing process which produces the sum and difference frequencies of the oscillator 14 and the received RF signal at the input to the transistor 16. Resistor R1 slowly discharges capacitors C1 and C2, regulating the amount of peak current flowing through diodes D1–D4 during the time when the pulse is delivered by pulse generator 14.

Should a strong adjacent frequency signal be present, the desired on frequency signal, using the instant invention, will not be attenuated by adjacent frequency signals. The IF stage 24 amplifies only the IF signal. The frequency characteristics of crystal 22 is chosen to be series resonant having a very high impedance to all frequencies except the IF. Thus, the emitter leg of transistor 16 is essentially open circuited to all other frequencies other than the IF. The output of the IF stage 24 may then be coupled to an additional IF amplification circuit, if desired, for further reduction of unwanted signals, while increasing the amplification of the desired signal.

In utilizing the instant invention it can be seen that by providing very short duration pulses from the local oscillator 14, the local oscillator then has a low power requirement which enables the instant invention to be utilized in a battery powered RF receiver, since the front end portion of the receiver has a lower power demand. The term front end as utilized in the instant invention refers to the circuitry in an RF receiver from the signal source to the first IF amplifier.

The instant invention has been shown and described herein in what is considered to be the most practical and preferred embodiment. It is recognized, however, that departures may be made therefrom within the scope of the invention and that obvious modifications will occur to a person skilled in the art.

What I claim is:

1. A high dynamic receiver front end for a radio frequency receiver requiring relatively low local oscillator injection power comprising:
   a RF signal receiving means;
   a diode bridge RF signal mixing means connected at an input junction to said RF signal receiving means, said bridge having an input junction, an output junction, and a pair of intermediate junctions;
   resistance means coupled across said intermediate bridge junctions;
   local oscillator coupled across said bridge, said diodes arranged having a pair of diodes in each of said bridge branches having anodes disposed across one of said intermediate junctions and a second pair of diodes connected to said second intermediate junction havig their cathodes coupled to the second intermediate junction;
   capacitive means connected to the output junction of said bridge; and
   an IF amplification means coupled to the output junction of said bridge, said IF amplification means including a frequency selecting means for selecting a predetermined frequency received from said bridge output junction.

2. A device, as in claim 1, which includes:
   capacitive means coupling said intermediate bridge junction points with said local oscillator; and
   said IF amplification means including a transistor having its base coupled to said output of said bridge, a resonant frequency crystal filter means coupled to the emitter of said transistor and an output means coupled to the collector of said transistor whereby the local oscillator turns said bridge sampling means on and off providing a mixing of the incoming received RF signal and said local oscillator pulsing frequency.

3. A device, as in claim 2, in which said local oscillator produces low duty cycle pulses, said pulses rendering said bridge conductive and thus connecting said received RF signal to said IF amplification means during said pulses, and in which said bridge is non-conductive during the period between said pulses.

* * * * *